(12) United States Patent
Takeya et al.

(10) Patent No.: US 9,142,688 B2
(45) Date of Patent: Sep. 22, 2015

(54) GALLIUM NITRIDE-BASED DIODE AND METHOD OF FABRICATING THE SAME

(71) Applicant: Seoul Semiconductor Co., Ltd., Ansan-si (KR)

(72) Inventors: Motonobu Takeya, Ansan-si (KR); Kang Nyung Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/447,225

(22) Filed: Jul. 30, 2014

(65) Prior Publication Data

US 2015/0034964 A1 Feb. 5, 2015

(30) Foreign Application Priority Data

Jul. 30, 2013 (KR) .................. 10-2013-0090052

(51) Int. Cl.
*H01L 29/78* (2006.01)
*H01L 29/872* (2006.01)
*H01L 21/02* (2006.01)
(Continued)

(52) U.S. Cl.
CPC .......... *H01L 29/872* (2013.01); *H01L 21/0242* (2013.01); *H01L 21/0254* (2013.01); *H01L 21/02609* (2013.01); *H01L 21/02647* (2013.01); *H01L 29/0619* (2013.01); *H01L 29/0649* (2013.01); *H01L 29/2003* (2013.01); *H01L 29/475* (2013.01); *H01L 29/66143* (2013.01);
(Continued)

(58) Field of Classification Search
CPC . H01L 29/778; H01L 29/782; H01L 29/0649; H01L 21/0242

USPC .................................... 257/471, 615
See application file for complete search history.

(56) References Cited

U.S. PATENT DOCUMENTS 5,930,636 A    7/1999  Oki et al.
7,400,000 B2 *  7/2008  Otsuka et al. ............. 257/189
(Continued)

FOREIGN PATENT DOCUMENTS

EP      2469581      6/2012
KR  10-1997-0077615  12/1997

OTHER PUBLICATIONS

T. S. Zheleva, et al., "Pendeo-Epitaxy: A New Approach for lateral Growth of Gallium Nitride Films", Journal of Electronic Materials, Apr. 1, 1999, pp. L05-L08, vol. 28, No. 4, Warrendale, PA, United States.

(Continued)

*Primary Examiner* — Nathan Ha
(74) *Attorney, Agent, or Firm* — H.C. Park & Associates, PLC

(57) ABSTRACT

A GaN-based diode may include an intrinsic GaN-based semiconductor layer, GaN-based semiconductor layers configured to have a first conductivity type and bonded to the intrinsic GaN-based semiconductor layer. A first electrode made of metal is placed on a surface opposite a surface bonded to the GaN-based semiconductor layers of the intrinsic GaN-based semiconductor layer; a second electrode is placed on a surface opposite to a surface bonded to the intrinsic GaN-based semiconductor layer of the GaN-based semiconductor layers of the first conductivity type. Voltage-resistant layers configured to have a second conductivity type are formed in regions of the intrinsic GaN-based semiconductor layer that come in contact with edges of the first electrode.

7 Claims, 7 Drawing Sheets

(51) Int. Cl.
  *H01L 29/20* (2006.01)
  *H01L 29/47* (2006.01)
  *H01L 29/66* (2006.01)
  *H01L 29/06* (2006.01)
  *H01L 29/32* (2006.01)
  *H01L 29/04* (2006.01)

(52) U.S. Cl.
  CPC ........ *H01L 29/66212* (2013.01); *H01L 29/045* (2013.01); *H01L 29/32* (2013.01)

(56) References Cited

U.S. PATENT DOCUMENTS

| | | | |
|---|---|---|---|
| 7,675,076 B2* | 3/2010 | Otsuka et al. | 257/96 |
| 8,653,534 B2* | 2/2014 | Zhang et al. | 257/77 |
| 2010/0065807 A1* | 3/2010 | Takagi et al. | 257/5 |
| 2011/0260777 A1* | 10/2011 | Suzuki et al. | 327/493 |
| 2012/0056743 A1 | 3/2012 | Lyon et al. | |
| 2012/0133009 A1* | 5/2012 | Sasaki | 257/429 |
| 2012/0138951 A1 | 6/2012 | Hayashi et al. | |
| 2012/0223333 A1* | 9/2012 | Mizukami | 257/77 |
| 2013/0087878 A1* | 4/2013 | Edwards et al. | 257/472 |
| 2014/0138697 A1* | 5/2014 | Lin | 257/76 |
| 2014/0167064 A1* | 6/2014 | Hurkx et al. | 257/76 |
| 2014/0319532 A1* | 10/2014 | Werner | 257/76 |
| 2014/0375287 A1* | 12/2014 | Blanchard et al. | 323/271 |

OTHER PUBLICATIONS

J. W. Johnson, et al., "Breakdown Voltage and Reverse Recovery Characteristics of Free-Standing GaN Schottky Rectifiers", IEEE Transactions on Electron Devices, Jan. 1, 2002, pp. 32-36, vol. 49, No. 1., Piscataway, NJ, United States.

A. Y. Polykov, et al., "Electrical properties of undoped GaN films grown by maskless epitaxial lateral overgrowth", Journal of Applied Physics, American Institute of Physics, Feb. 28, 2013, pp. 083712-1-083712-6, vol. 113, No. 8., United States.

T. Zheleva, et al., "Improved performance of Schottky diodes on pendeoepitaxial gallium nitride", Applied Physics, Sep. 5, 2008, pp. 091909-1-091901-3, vol. 93, No. 9, United States.

P. Kozodoy, et al., "Electrical characterization of GaN p-n junctions with and without threading dislocations", Applied Physics Letters, American Institute of Physics, Aug. 17, 1998, pp. 975-977, vol. 73, No. 7, United States.

European Search Report issued Feb. 4, 2015, in corresponding EP Application 14179127.1-1552/2833412.

* cited by examiner

GALLIUM NITRIDE-BASED DIODE AND METHOD OF FABRICATING THE SAME

CROSS-REFERENCES TO RELATED APPLICATION

The present application claims priority under 35 U.S.C. 119(a) to Korean Application No. 10-2013-0090052, filed on Jul. 30, 2013, in the Korean Intellectual Property Office, which is incorporated herein by reference in its entirety.

BACKGROUND

Exemplary embodiments of the present disclosure relate to a gallium nitride (GaN)-based Schottky diode and a method of fabricating the same.

For rectification, a three-phase AC generator, a generator AC bridge, or a rectifier is used. In general, the rectifier is formed of 6 semiconductors each having a pn switching unit made of silicon. In order for the diodes to operate, the diodes are designed to tolerate high current (e.g., up to current density of 500 A/cm$^2$) and high temperature (e.g., up to a depletion layer temperature Tj of <225° C.). In general, a voltage drop in a flow direction, that is, a flow voltage UF, is about 1 volt at high current levels. When the diodes operate in a blocking direction, a very low blocking current IR flows up to a breakdown voltage UZ. The blocking current greatly rises upon reaching the breakdown voltage UZ. Accordingly, rise of a voltage higher than the breakdown voltage UZ is suppressed.

Diodes are divided into a high-blocking diode (HS-diode) having a breakdown voltage UZ in a region between about 200 to 400 volts and a Z-diode having a blocking voltage in response to voltage of a vehicle electricity system between about 20 to 40 volts. The high-blocking diodes (HS-diodes) should not operate at breakdown. The Z-diodes may also be subject to a load up to a very high voltage within a short time at breakdown. Accordingly, the diodes are installed to restrict voltage of a generator that has excessively risen when a load varies or a load dump drops.

Some of the well-known disadvantages of a pn-diode flow voltage include a forward loss and reduced efficiency of the generator attributable to the forward loss. In a generator of 100 A, an average forward loss reaches about 200 W because two diodes connected in series are inserted into the center of the generator. The heating of diodes and a rectifier related to the generator needs to be reduced by expensive cooling measures (e.g., a cooler and/or a fan).

In general, so-called Schottky Barrier Diodes (SBDs) are mounted instead of the pn-diodes in order to reduce a forward loss. The Schottky-diode is a metal-semiconductor conversion device having an electrical characteristic curve similar to that of the pn-diode. Unlike in the pn-diode, in the Schottky-diode, a flow voltage can be freely selected within a specific limit by selecting a metal, and may be set to be lower than that of the pn-diode. Accordingly, the flow voltage UF of 0.5 V to 06 V, for example, may be implemented without difficulties. When metal is selected, a so-called (energy-) barrier height (PhiBn) is defined. Only electrons capable of overcoming the barrier may help a current flow. The barrier height may have an influence on properly selecting a "barrier metal". Furthermore, the barrier height (PhiBn) is also applied to a semiconductor used (semiconductor materials: a covalent bond or ion semiconductor, n- or p-doping).

In general, the Schottky diode has low price competitiveness because it is made with an expensive gallium nitride (GaN) substrate.

SUMMARY

An embodiment of the present disclosure relates to a GaN-based Schottky diode that is inexpensive and has excellent characteristics.

An embodiment of the present disclosure relates to a GaN-based Schottky diode fabricated in a sapphire substrate and configured to have a high voltage-resistant characteristic.

In one embodiment, a GaN-based diode may include an intrinsic GaN-based semiconductor layer, GaN-based semiconductor layers configured to have a first conductivity type and bonded to the intrinsic GaN-based semiconductor layer, a first electrode made of metal and placed on a surface opposite a surface bonded to the GaN-based semiconductor layers of the intrinsic GaN-based semiconductor layer, a second electrode placed on a surface opposite to a surface bonded to the intrinsic GaN-based semiconductor layer of the GaN-based semiconductor layers of the first conductivity type, and voltage-resistant layers configured to have a second conductivity type and formed in regions of the intrinsic GaN-based semiconductor layer that come in contact with edges of the first electrode.

The intrinsic GaN-based semiconductor layer may be formed by growing the voltage-resistant layers as a seed layer in an Epitaxial Lateral Overgrowth (ELO) manner.

The GaN-based diode may further include Threading Dislocation (TD) blocking insulating layers configured to block a TD generated in areas overlapping the second conductivity type voltage-resistant layers.

The GaN-based semiconductor layers of the first conductivity type may be formed by performing ELO growth on exposed surfaces of the intrinsic GaN-based semiconductor layer, not covered with the TD blocking insulating layers, in the first conductivity type in the state in which the TD blocking insulating layers have been formed over the intrinsic GaN-based semiconductor layer.

The intrinsic GaN-based semiconductor layer may be formed by performing ELO growth using the GaN-based semiconductor layers of the first conductivity type as a seed layer.

The GaN-based diode may further include a substrate made of thermally conductive materials and attached to the second electrode.

In another embodiment, a method of fabricating a GaN-based diode may include forming GaN-based semiconductor layers of a second conductivity type in some regions over a sapphire substrate, forming an intrinsic GaN-based semiconductor layer by growing a GaN-based semiconductor in an ELO manner using the GaN-based semiconductor layers of the second conductivity type as a seed layer, forming lower TD blocking insulating layers in some regions over the intrinsic GaN-based semiconductor layer, forming GaN-based semiconductor layers of a first conductivity type by growing a GaN-based semiconductor of the first conductivity type in an ELO manner using the lower TD blocking insulating layers as an ELO growth mask, forming a second electrode made of conductive materials over the GaN-based semiconductor layers of the first conductivity type and the lower TD blocking insulating layers, attaching a second substrate made of metal to the second electrode, removing the sapphire substrate, forming upper TD blocking insulating layers in areas of a surface from which the sapphire substrate has been removed which overlap the lower TD blocking insulating layers, and forming a first electrode in a region over the upper TD blocking insulating layers.

In forming the GaN-based semiconductor layers of the second conductivity type in some regions over the sapphire substrate, GaN may be grown in a <1$\bar{1}$00> direction or in a <11$\bar{2}$0> direction.

The first electrode may be formed by depositing Ni or Au.

The second electrode may be made of a metal material, including at least one of Ti, Al, Au, and Ni, or AuSn.

In another embodiment, a gallium nitride (GaN)-based diode may include an intrinsic GaN-based semiconductor layer, GaN-based semiconductor layers with n+ type and bonded to the intrinsic GaN-based semiconductor layer, a first electrode made of metal and positioned on a surface opposite a surface bonded to the GaN-based semiconductor layers of the intrinsic GaN-based semiconductor layer, a second electrode positioned on a surface opposite to a surface bonded to the intrinsic GaN-based semiconductor layer of the GaN-based semiconductor layers of the n+ type, and voltage-resistant layers with a p type and formed in regions of the intrinsic GaN-based semiconductor layer that come in contact with edges of the first electrode.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Figure 1A:
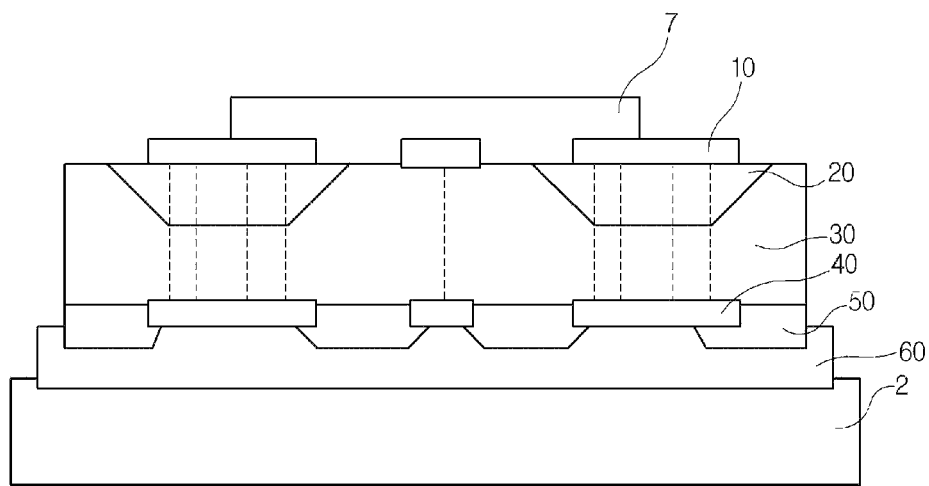
FIG. 1A is a cross-sectional view illustrating the structure of a GaN-based diode according to an embodiment of the present disclosure.

Hereinafter, some embodiments of the present disclosure are described with reference to the accompanying drawings. The thickness of lines and the size of elements shown in the drawings may have been enlarged for the clarity of a description and for convenience.

Furthermore, terms to be described later are defined by taking the functions of embodiments of the present disclosure into consideration, and may be different according to the operator's intention or usage. Accordingly, the terms should be defined based on the overall contents of the specification.

For example, in the specification, when it is described that a layer is "on" another layer or a substrate, the layer may be directly formed on another layer or the substrate or a third layer may be interposed between the layer and another layer or the substrate. Furthermore, in the specification, directional expressions, such as "the upper side", an "upper part", and an "upper surface" may also be understood as meanings, such as "the lower side", a "lower part", and a "lower surface". That is, expressions in spatial directions should be interpreted as being relative directions, but should not be interpreted as being limited as if the spatial directions mean absolute directions.

Furthermore, the following embodiments are not intended to limit the scope of the present disclosure, but are intended to illustrate elements proposed in the claims of the present disclosure. An embodiment including an element that is included in the technical spirit written in the specification of the present disclosure and that may be substituted with an element of the claims may be included in the scope of the present disclosure.

Figure 1B:
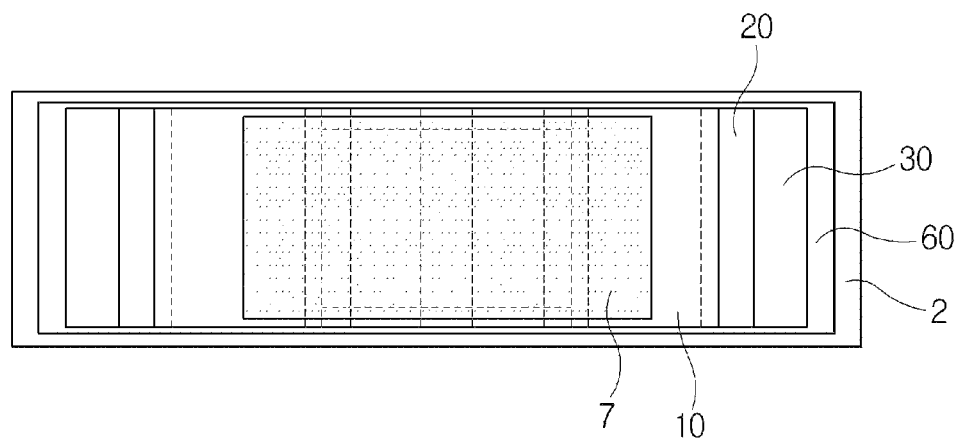
FIG. 1B is a plan view illustrating the structure of the GaN-based diode according to an embodiment of the present disclosure.

FIGS. 1A and 1B illustrate the structure of a GaN-based diode according to an embodiment of the present disclosure. The illustrated GaN-based diode includes an intrinsic GaN-based semiconductor layer 30, n+type GaN-based semiconductor layers 50 configured to have a first conductivity type and bonded to the intrinsic GaN-based semiconductor layer 30, a first electrode 7 made of metal and placed on a surface opposite a surface bonded to the intrinsic GaN-based semiconductor layer 30, a second electrode 60 placed on a surface opposite to the Schottky junctions of the n+type GaN-based semiconductor layers 50 of the first conductivity type, and p type voltage-resistant layers 20 formed in some regions of the intrinsic GaN-based semiconductor layer 30 that come in contact with the edges of the first electrode 7.

The first electrode 7 functions as a kind of Schottky metal. The first electrode 7 and the n+type GaN-based semiconductor layer 50 form a Schottky barrier with the intrinsic GaN-based semiconductor layer 30 interposed therebetween. That is, the intrinsic GaN-based semiconductor layer 30 may function as an epitaxial layer in which a depletion layer between the first electrode 7, that is, Schottky metal, and the n+type GaN-based semiconductor layer 50 is formed.

In a forward bias state, the n+type GaN-based semiconductor layer 50 transfers its electrons to the intrinsic GaN-based semiconductor layer 30 so that the intrinsic GaN-based semiconductor layer 30 functions as an epitaxial layer in terms of the Schottky barrier structure.

In another implementation, an n-type GaN-based semiconductor layer doped with impurities having a lower concentration than those of the n+type GaN-based semiconductor layer 50 may be formed instead of the intrinsic GaN-based semiconductor layer 30.

The illustrated GaN-based diode includes Threading Dislocation (TD) blocking insulating layers 10 and 40 for blocking a TD in the central area of the stack structure and areas that overlap the p type voltage-resistant layers 20. The TD blocking insulating layers 10 and 40 may include lower TD blocking insulating layers 40 formed on the junctions of the intrinsic GaN-based semiconductor layer 30 and the n+type GaN-based semiconductor layer 50 and upper TD blocking insulating layers 10 formed on the junctions of the intrinsic GaN-based semiconductor layer 30 and the first electrode 7.

The TD blocking insulating layers 10 and 40 function to suppress a side effect attributable to a TD that is generated when fabricating the GaN-based Schottky diode according to the present embodiment using a method of growing a GaN-based semiconductor on a sapphire substrate having a relatively low manufacturing cost in an Epitaxial Lateral Overgrowth (ELO) manner.

A TD may be formed in the central area of the stack structure. As illustrated, the upper/lower TD blocking insulating layers 10 and 40 are formed in order to block such a TD.

The p type voltage-resistant layers 20, together with the first electrode 7 made of metal, form Schottky junctions corresponding to the intrinsic GaN-based semiconductor layer 30. Since the p type voltage-resistant layer 20 is present, the Schottky junction has a shape similar to that of a trench, thereby being capable of further increasing a forward current density. The p type voltage-resistant layers 20 are also formed under the edges of the first electrode 7, that is, areas on which a TD is concentrated, thus contributing to obtaining a high voltage-resistant characteristic along with the TD blocking insulating layers 10 and 40.

The first electrode 7 functions as the anode electrode of the GaN-based Schottky diode, and the second electrode 60 functions as the cathode electrode of the GaN-based Schottky diode.

The first electrode 7 is made of metal because it functions as a Schottky metal that forms the Schottky junction. For example, the first electrode 7 may be formed by depositing Ni/Au.

The second electrode 60 may be made of conductive materials. If the usage of the GaN-based Schottky diode and heat-dissipation processing for the GaN-based Schottky diode is important, the second electrode 60 may be made of metal materials having excellent thermal conductivity. For example, the second electrode 60 may be formed by depositing Ti/Al/Ti/Au or using AuSn. In some implementations, the second electrode 60 may be attached to a thermally conductive substrate for dissipating heat, or may be part of a structure (e.g., a via hole or a draw line) for configuring a circuit.

Figure 2A:
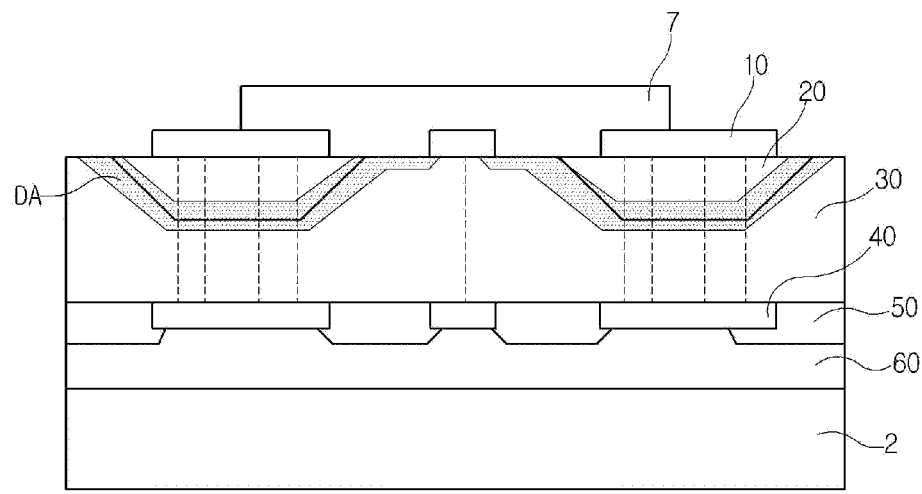
FIG. 2A is a cross-sectional view of a depletion layer when the GaN-based diode of FIG. 1A is in a floating state.
Figure 2B:
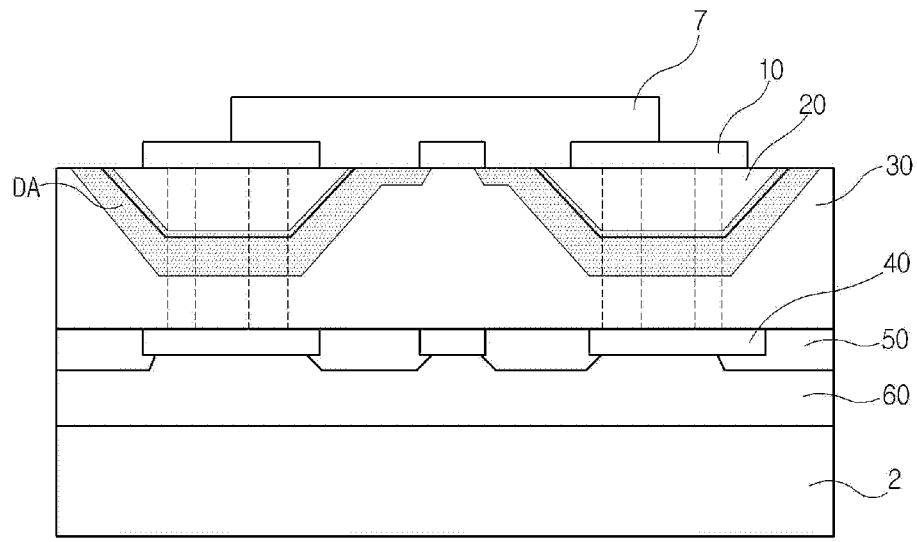
FIG. 2B is a cross-sectional view of the depletion layer when the GaN-based diode of FIG. 1A is in a reverse bias state.

FIG. 2A is a cross-sectional view of the depletion layer DA when the GaN-based diode of FIG. 1A is in the floating state, and FIG. 2B is a cross-sectional view of the depletion layer DA when the GaN-based diode of FIG. 1A is in the reverse bias state.

Figure 3A:
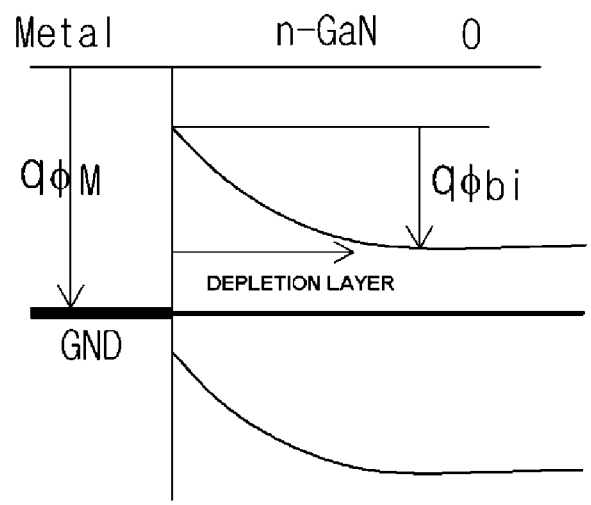
FIG. 3A is a graph illustrating the potential barrier of the depletion layer when the GaN-based diode of FIG. 1A is in a floating state.
Figure 3B:
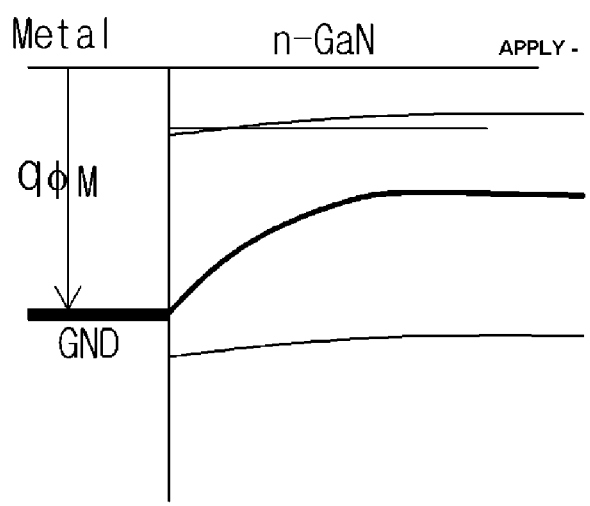
FIG. 3B is a graph illustrating the potential barrier of the depletion layer when the GaN-based diode of FIG. 1A is in a forward bias state.
Figure 3C:
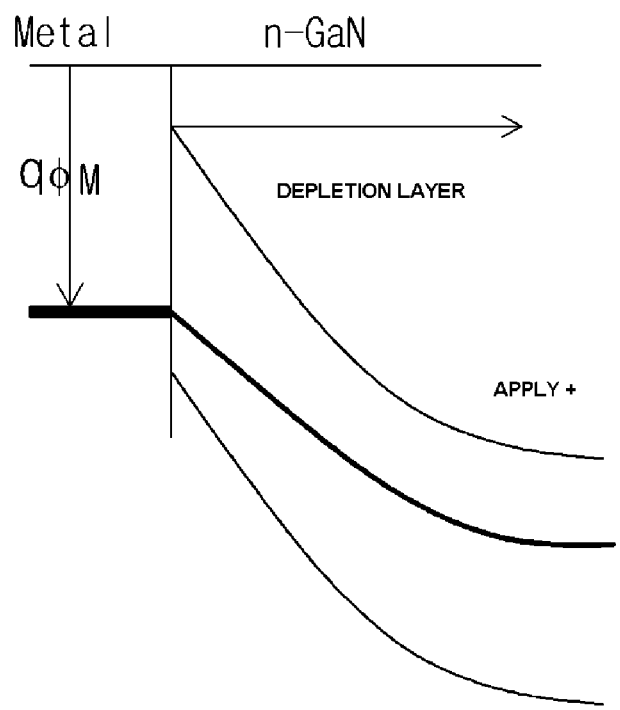
FIG. 3C is a graph illustrating the potential barrier of the depletion layer when the GaN-based diode of FIG. 1A is in a reverse bias state.

FIG. 3A is a graph illustrating the potential barrier of the depletion layer when the GaN-based diode of FIG. 1A is in the floating state, FIG. 3B is a graph illustrating the potential barrier of the depletion layer when the GaN-based diode of FIG. 1A is in the forward bias state, and FIG. 3C is a graph illustrating the potential barrier of the depletion layer when the GaN-based diode of FIG. 1A is in the reverse bias state.

As illustrated in FIGS. 2A and 3A, in the GaN-based Schottky diode of the present embodiment, the potential barrier for blocking a movement of charge carriers between the anode electrode and the cathode electrode in the floating state is formed at the junction of metal and the n type GaN-based semiconductor.

When a forward bias is applied between the anode electrode and the cathode electrode, the potential barrier moves downward and a flow of charge carriers along which an electric current flows forward, as illustrated in FIG. 3B.

In contrast, when a reverse bias is applied between the anode electrode and the cathode electrode, the potential barrier for blocking a movement of charge carriers becomes high, thus blocking a flow of charges, as illustrated in FIGS. 2B and 3C.

FIGS. 4A to 4G are cross-sectional views illustrating a method of fabricating the GaN-based diode of FIG. 1A.

Figure 4A:
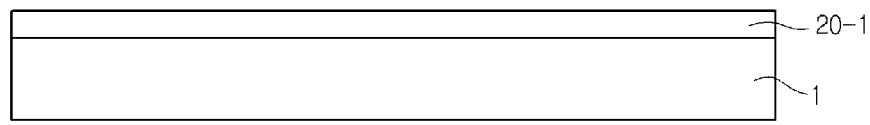
FIGS. 4A to 4G are cross-sectional views illustrating a method of fabricating the GaN-based diode of FIG. 1A.

As illustrated in FIG. 4A, a p type GaN-based semiconductor layer 20-1 is formed on a sapphire substrate 1 to a specific thickness. For example, the p type GaN-based semiconductor layer 20-1 having a thickness of 2 μm may be formed using Mg as a dopant. In another implementation, an intrinsic GaN-based semiconductor layer may be formed instead of the p type GaN-based semiconductor layer 20-1.

As illustrated in FIG. 4A, the p type GaN-based semiconductor layer 20-1 may be formed in such a way as to grow the p type GaN-based semiconductor layer 20-1 on a GaN structure in a <1$\bar{1}$100> direction. In another implementation, the p type GaN-based semiconductor layer 20-1 may be grown on the GaN structure in a <11$\bar{2}$0> direction.

Figure 4B:
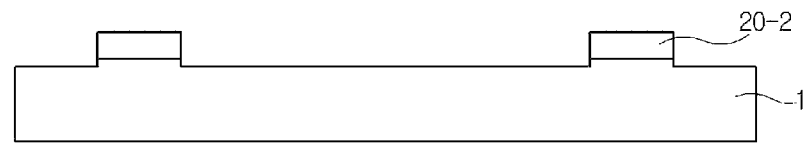

Thereafter, as illustrated in FIG. 4B, a seed p type GaN-based semiconductor layer 20-2 is formed by etching the p type GaN-based semiconductor layer 20-1 of FIG. 4A. Although not illustrated, it is evident that other processes, such as photolithography for etching, are included. It may be seen that some of the sapphire substrate 1 has been etched by the etching.

Figure 4C:
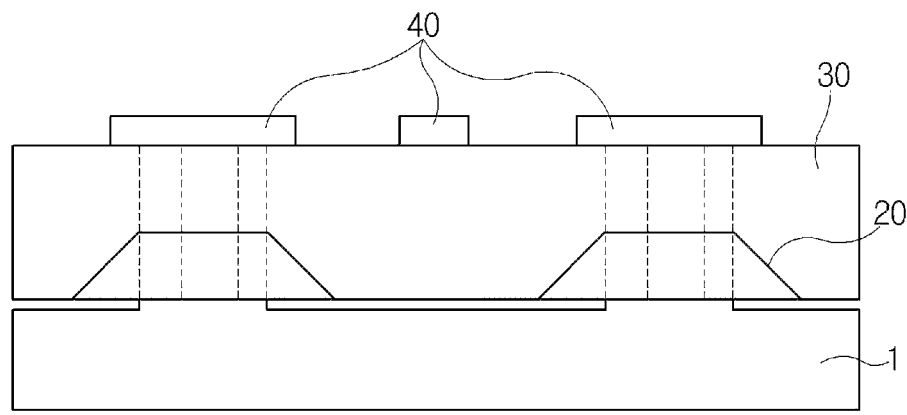

Thereafter, as illustrated in FIG. 4C, the intrinsic GaN-based semiconductor layer 30 is formed by growing the GaN-based semiconductor using the seed p type GaN-based semiconductor layer 20-2 as a seed layer in an ELO manner. The lower TD blocking insulating layers 40 are formed on the intrinsic GaN-based semiconductor layer 30. The lower TD blocking insulating layers 40 may be deposited using $SiO_2$ materials, for example, and may be then formed into shapes, such as those illustrated in FIG. 4C, by an etch process, such as photolithography.

The seed p type GaN-based semiconductor layers 20-2 are partially grown by ELO growth, thus having the shapes of the p type voltage-resistant layers 20 of FIG. 1A.

The lower TD blocking insulating layers 40 may be selectively formed in the upper regions of the seed p type GaN-based semiconductor layers 20-2 in which a TD is likely to occur and the central area of the entire ELO growth structure.

Figure 4D:
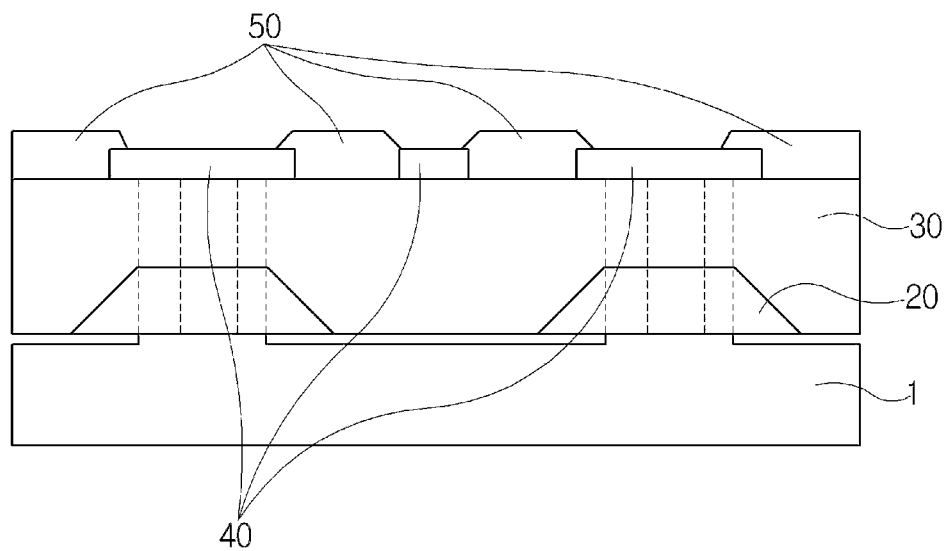

Thereafter, as illustrated in FIG. 4D, the n+type GaN-based semiconductor layers 50 are formed by growing an n+type GaN-based semiconductor in an ELO manner using the lower TD blocking insulating layers 40 as an ELO growth mask.

Figure 4E:
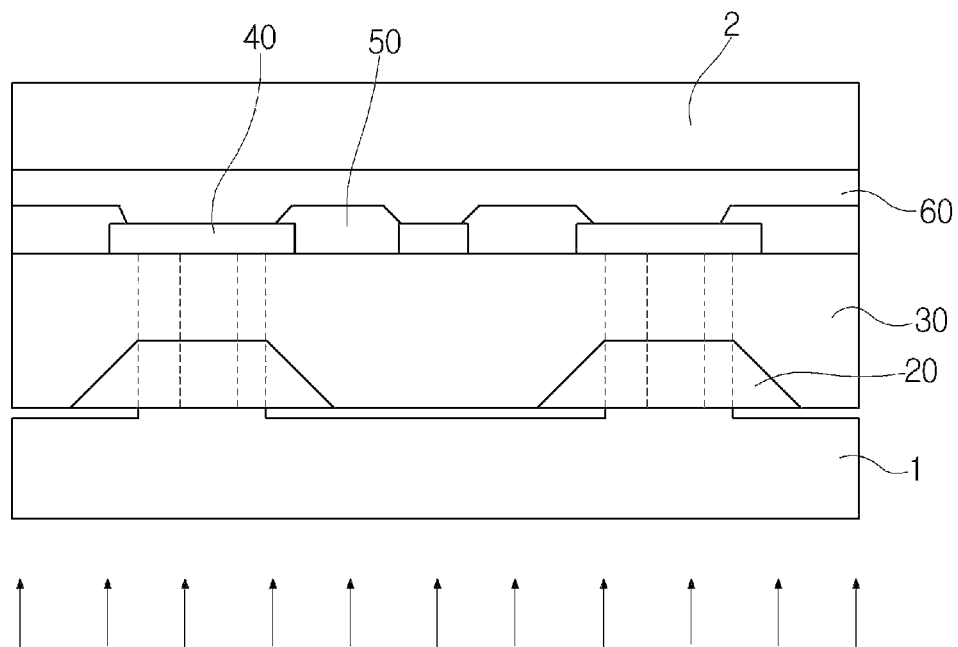

Thereafter, as illustrated in FIG. 4E, the second electrode 60 made of conductive materials is formed on the n+type GaN-based semiconductor layers 50 and the lower TD blocking insulating layers 40. A second substrate 2 made of metal is attached to the second electrode 60. The second electrode 60 may be formed of a conductive layer made of non-metallic conductive materials, but is advantageously made of metal, such as Ti/Al/Au or Ni/Au, or AuSn since the usage of the Schottky diode and the dissipation of heat due to metal characteristics are important. The second substrate 2 may be made of non-metal capable of securing physical strength, but is advantageously made of metal, such as Mo/Si in terms of the dissipation of heat.

Furthermore, the stack structure of FIG. 4E may be inverted, and a process of removing the sapphire substrate 1 may be performed. For example, the sapphire substrate 1 may be removed by a laser lift-off process. In some implementations, dry etch may be performed in order to remove a surface damaged by the lift-off process.

Figure 4F:
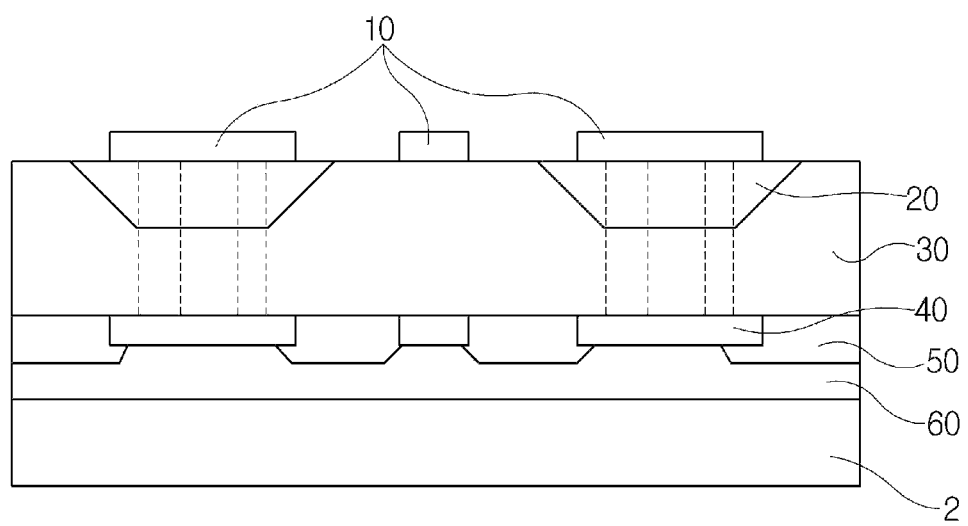

Thereafter, as illustrated in FIG. 4F, the upper TD blocking insulating layers 10 are formed at places that overlap the lower TD blocking insulating layers 40 over a surface from which the sapphire substrate 1 has been removed. The upper TD blocking insulating layers 10 may be deposited using $SiO_2$ materials, for example, and may be then formed into shapes, such as those illustrated in FIG. 4F, by an etch process, such as photolithography.

Figure 4G:
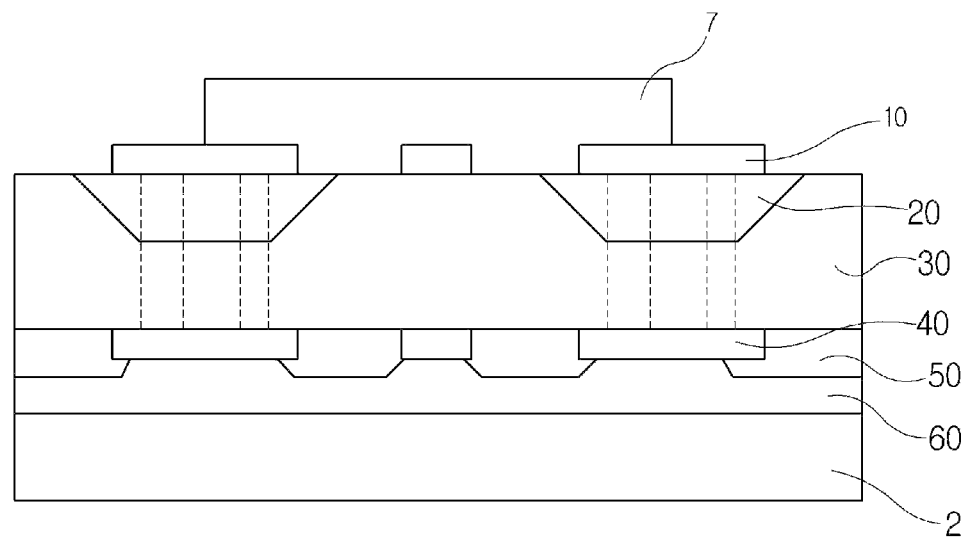

Thereafter, as illustrated in FIG. 4G, the first electrode 7 made of metal, that is, a Schottky metal, is formed in a region over the upper TD blocking insulating layers 10. For example, the first electrode 7 may be formed by depositing Ni/Au. The first electrode 7 is formed in such a way as to cover part (e.g., about a half) of the upper region of the p type voltage-resistant layer 20 so that the p type voltage-resistant layers 20 are placed under the edges of the first electrode 7.

If the GaN-based diode according to an embodiment of the present disclosure is implemented, there is an advantage in that a Schottky diode having excellent characteristics can be inexpensively fabricated.

Furthermore, the present disclosure is advantageous in that it can provide a Schottky diode that is fabricated on a sapphire substrate and that has a high voltage-resistant characteristic.

Although the specific embodiments of the present disclosure have been illustrated, the present disclosure is not limited to the embodiments, and those skilled in the art to which the present disclosure pertains may change, substitute, and modify the present disclosure in various ways without departing from the scope and spirit of the present disclosure. Such changes, substitutions, and modifications should be construed as belonging to the accompanying claims of the present disclosure.

What is claimed is:

1. A gallium nitride (GaN)-based diode, comprising:
   an intrinsic GaN-based semiconductor layer;
   GaN-based semiconductor layers having a first conductivity type, a first surface thereof disposed on a first surface of the intrinsic GaN-based semiconductor layer;
   a first electrode disposed on a second surface of the intrinsic GaN-based semiconductor layer opposite to the first surface thereof;
   a second electrode disposed on a second surface of the GaN-based semiconductor layers opposite to the first surface thereof; and
   voltage-resistant layers having a second conductivity type and disposed in regions of the intrinsic GaN-based semiconductor layer contacting edges of the first electrode.

2. The GaN-based diode of claim 1, wherein the intrinsic GaN-based semiconductor layer is formed by growing the voltage-resistant layers as a seed layer in an Epitaxial Lateral Overgrowth (ELO) manner.

3. The GaN-based diode of claim 1, further comprising Threading Dislocation (TD) blocking insulating layers configured to block a TD generated in areas overlapping the second conductivity type voltage-resistant layers.

4. The GaN-based diode of claim 3, wherein the GaN-based semiconductor layers of the first conductivity type are formed by performing ELO growth on exposed surfaces of the intrinsic GaN-based semiconductor layer, not covered with the TD blocking insulating layers, in the first conductivity type in a state in which the TD blocking insulating layers have been formed over the intrinsic GaN-based semiconductor layer.

5. The GaN-based diode of claim 1, wherein the intrinsic GaN-based semiconductor layer is formed by performing ELO growth using the GaN-based semiconductor layers of the first conductivity type as a seed layer.

6. The GaN-based diode of claim 1, further comprising a substrate made of thermally conductive material and attached to the second electrode.

7. A gallium nitride (GaN)-based diode, comprising:
   an intrinsic GaN-based semiconductor layer;
   GaN-based semiconductor layers having an n+ type conductivity, a first surface thereof disposed on a first surface of the intrinsic GaN-based semiconductor layer;
   a first electrode disposed on a second surface of the intrinsic GaN-based semiconductor layer opposite to the first surface thereof;
   a second electrode disposed on a second surface of the GaN-based semiconductor layers opposite to the first surface thereof; and
   voltage-resistant layers having a p type conductivity and disposed in regions of the intrinsic GaN-based semiconductor layer contacting edges of the first electrode.

\* \* \* \* \*